(12) United States Patent
Kurosawa et al.

(10) Patent No.: US 6,678,841 B1
(45) Date of Patent: Jan. 13, 2004

(54) FUNCTION TEST SUPPORT SYSTEM AND FUNCTION TEST SUPPORT METHOD AND HARDWARE DESCRIPTION MODEL

(75) Inventors: Yuuichi Kurosawa, Hino (JP); Naohiko Okamoto, Ome (JP); Koichi Nishide, Tachikawa (JP); Tsukasa Matoba, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 539 days.

(21) Appl. No.: 09/662,229

(22) Filed: Sep. 14, 2000

(30) Foreign Application Priority Data

Oct. 1, 1999 (JP) .......................................... 11-281836

(51) Int. Cl.⁷ ................................................ G06F 11/00
(52) U.S. Cl. .......................................... 714/57; 714/33
(58) Field of Search ............................. 714/57, 26, 27, 714/30, 31, 37, 38, 46, 739, 741, 742, 33, 39

(56) References Cited

U.S. PATENT DOCUMENTS

| | | | | |
|---|---|---|---|---|
| 5,604,895 A | * | 2/1997 | Raimi .......................... 703/13 |
| 5,650,938 A | * | 7/1997 | Bootehsaz et al. .............. 716/6 |
| 5,920,830 A | * | 7/1999 | Hatfield et al. .............. 702/119 |
| 5,951,704 A | * | 9/1999 | Sauer et al. ................ 714/736 |
| 6,148,277 A | * | 11/2000 | Asava et al. ................. 703/22 |
| 6,182,258 B1 | * | 1/2001 | Hollander .................... 714/739 |
| 6,530,054 B2 | * | 3/2003 | Hollander .................... 714/739 |

FOREIGN PATENT DOCUMENTS

| | | |
|---|---|---|
| JP | 2000-113010 | 4/2000 |
| JP | 2000-137745 | 5/2000 |

OTHER PUBLICATIONS

PCI Source Model User's Manual, "The PCI System Testbench", Synopsys, Inc., pp. 27–29, Feb. 1999.
ModelSim EE/PLUS Reference Manual–Soliton Systems, pp. 131, 141–142, 146, 168, 169.

* cited by examiner

*Primary Examiner*—Nadeem Iqbal
(74) *Attorney, Agent, or Firm*—Finnegan, Henderson, Farabow, Garrett & Dunner, L.L.P.

(57) ABSTRACT

A statement is embedded in a description of a circuit for design in hardware description language stored in a function description storage section, the above statement outputting messages that test items have been tested according to a procedure stored in a package storage section. A function simulation executing section executes simulations to store the above messages in a message storage section. A report output section determines every test whether all the test items have been tested or not, based on messages stored in a message storage section, and data denoting a correspondence relationship between test vector names stored in a test data storage section and test items which are tested according to the above messages and outputs report of the determination results.

24 Claims, 9 Drawing Sheets

FIG. 1

```
entity MOD1 is
    port(ICLK:in std_logic;
         IINT:in std_logic_vector(2 downto 0);
         ...
        );
end example1;

architecture rtl of MOD1 is
    signal INTS1:std_logic;

type ST1 is(S10,S11,S12);
    signal C_STATE1:ST1;

type ST2 is(S20,S21,S22,S23);
    signal C_STATE2:ST1;

begin
    ...
  ··synopsys translate_off
 CHECK:process(ICLK)
     begin
a3~ if(C_STATE1=S11 and C_STATE2=S23)then
         if(IINT(2)='1')then
           check_assert("FUNC001"); ~a2
         end if;
         if(IINT(1)='1')then
           check_assert("FUNC002");
         end if;                                    } a1
         if(IINT(0)='1')then
           check_assert("FUNC003");
         end if;
       end if;
       ...
     end process;
  ··synopsys translate_on end rtl;
```

FIG. 2

```
procedure check_assert (item_name:string) IS
   variable out_line:line;
BEGIN write (out_line,"check point");
   write (out_line, item_name);
   write (out_line,"is covered");
   write_line (OUTPUT, out_line);

END check_assert;
```

FIG. 3 check_ point FUNC001 is covered

FIG. 4

| TEST VECTOR NAME | LIST OF TEST ITEM NAME | | |
|---|---|---|---|
| TEST001 | FUNC001 | | |
| TEST002 | FUNC002 | FUNC003 | |
| TEST003 | FUNC004 | | |
| TEST004 | FUNC005 | FUNC006 | FUNC007 |

FIG. 5

| TEST001 | cover |
|---|---|
| TEST002 | cover |
| TEST003 | cover |
| TEST004 | uncover | coverage=75%

FIG. 8A
```
check point FUNC001 is covered
```
TEST001.out

FIG. 8B
```
check point FUNC003 is covered
check point FUNC002 is covered
check point FUNC003 is covered
check point FUNC002 is covered
```
TEST002.out FIG. 8C
```
check point FUNC004 is covered
check point FUNC001 is covered
```
TEST003.out FIG. 8D
```
check point FUNC006 is covered
check point FUNC007 is covered
check point FUNC001 is covered
check point FUNC007 is covered
```
TEST004.out

FIG. 9

```
procedure check_assert (test_name:string;
                        item_name:string) IS
    variable out_line:line;
BEGIN write (out_line,"check point");
  write (out_line, test_name);
  write (out_line, ":");
  write (out_line, item_name);
  write (out_line, "is covered");
  write_line (OUTPUT, out_line);

END check_assert;
```
FIG. 10

FIG. 11  check_point TEST001:1/1 is covered

```
··synopsys translate_off
 CHECK:process(ICLK)
    begin
      if(C_STATE1=S11 and C_STATE2=S23)then
        if(IINT(2)='1')then
          check_assert("TEST001","1/1");
        end if;
        if(IINT(1)='1')then
          check_assert("TEST002","1/2");
        end if;
        if(IINT(0)='1')then
          check_assert("TEST002","2/2");
        end if;
      end if;
      ...
    end process;
··synopsys translate_on end rtl;
```

FIG. 12

FIG. 13A  check point TEST001:1/1 is covered
TEST001.out

FIG. 13B
check point TEST002:2/2 is covered
check point TEST002:1/2 is covered
check point TEST002:2/2 is covered
check point TEST002:1/2 is covered
TEST002.out FIG. 13C
check point TEST001:1/1 is covered
check point TEST003:1/1 is covered
TEST003.out FIG. 13D
check point TEST004:2/3 is covered
check point TEST004:3/3 is covered
check point TEST001:1/1 is covered
check point TEST004:3/3 is covered
TEST004.out

```
entity a_t0_b is
        generic(
                W:integer:=0
        );
        port(
                CLK:in std_logic;
                A  :in std_logic;
                B  :in std_logic
        );
end a_t0_b;
architecture a_to_b_logic of a_to_b is
    begin process
    variable lo:line;
    variable cc:integer:=0;
    begin
        wait until CLK'event and CLK='1';
        if (A='1')then
            cc:=0;
            if (B='1')then
                write (lo,"check point");
                writeline (output,lo);
                    assert (false) severity note;
                write (lo,"is covered");

writeline (output,lo);
            and if;
        elsif (A='0')then
            if (B='0')then
                if(cc<W)then
                    cc:=cc+1;
                end if;
            elsif (B='1' and(cc<W)then
                write (lo,"check point");
                writeline (output,lo);
                    assert (false) severity note;
                write (lo,"is covered");
                writeline (output,lo);
                cc:=W;
            end if;
          end if;
    end process;
  end a_t0_b_logic;
```

FIG. 18

```
entity MOD1 is
    port(ICLK:in std_logic;
         IINT:in std_logic_vector(2 downto 0);
         ...
        );
end example1;

architecture rtl of MOD1 is
    signal INTS1:std_logic;

type ST1 is(S10, S11, S12);
    signal C_STATE1:ST1;

type ST2 is(S20, S21, S22, S23);
    signal C_STATE2:ST1;
        ...
··synopsys translate_off
    signal CHECK004:std_logic;
··synopsys translate_on
begin

...

··synopsys translate_off
CHECK004≦'1'
        when(C_STATE1=S11 and C_STATE2=S23)
        slse'0';
FUNC004:a_to_b
        generic map(1)
        port    map(ICLK, CHECK004, IINT(2));

...

end process;
··synopsys translate_on end rtl;
```
⎱b

FIG. 19

```
check point
**Note:Assrtion violation.
Time:16504 us  Iteration:5  Instance:/m0/m11/func004
is covered
```

FIG. 20

| TEST ITEM NAME | LIST OF TEST VECTOR NAME | |
|---|---|---|
| FUNC001 | TEST001 | |
| FUNC002 | TEST002 | |
| FUNC003 | TEST002 | |
| FUNC004 | TEST002 | TEST008 |

FIG. 21

| FUNC001 | cover |
|---|---|
| FUNC002 | cover |
| FUNC003 | cover |
| FUNC004 | uncover | coverage=75%

FIG. 22

FUNCTION TEST SUPPORT SYSTEM AND FUNCTION TEST SUPPORT METHOD AND HARDWARE DESCRIPTION MODEL

CROSS-REFERENCE TO RELATED APPLICATIONS

This application is based upon and claims the benefit of priority from the prior Japanese Patent Application No. 11-281836, filed Oct. 1, 1999, the entire contents of which are incorporated herein by reference.

BACKGROUND OF THE INVENTION

The present invention relates to a function test support system, a function test support method and a hardware description model to be applied to a CAD system to support hardware design using a computer.

In function and logic design of a LSI, functions to be designed are described as a set of element operations in a language of a hardware description language (HDL), which is verified by function simulation. The function simulation is performed not only in a single form of a LSI to be designed, but also in a combined form of the above LSI with other LSI models (external models) connected to the above LSI. For example, function simulation of a bus bridge LSI connected to a CPU bus is performed according to the following steps: a CPU and external models of memories are connected; test items for functions and internal states of the LSI to be designed are set; test vectors to cover the above test items are formed; and it is verified, using the above test vectors, that operations such as memory write in and read from the CPU are correctly performed (a document "PCI Source Model User's Manual" by Synopsys,Inc. February 1999). Now, operations such as memory write and read may be correctly and easily performed, for example, by writing a description in an external model, the above description enabling expected value comparison of the read and write values to be performed at the last part of the simulation. However, "have test items set by a designer been met (tested) ?", that is, "has a model of a LSI to be designed been made in a required state at a time in the simulation by a test vector ?" requires to trace signal values of the model to be designed, and confirm a list or waveform of the trace results after completion of the simulation (a document "ModelSim EE reference manual" by Soliton Systems Co., Ltd.). Especially, when it is impossible to confirm whether the test items have been met, unless a relationship among a plurality of signals at different items, such as a relationship of "a signal B becomes 1 within three cycles after a signal A becomes 1." is checked, there has been a problem that the confirmation requires much labor, and errors easily occur. Moreover, when it is impossible to meet the previous test items by change in the function description during the design process, it is required to correct and/or add test vectors. Thereby, the above method to confirm the waveforms has caused a problem requiring much labor for checking the confirmation.

BRIEF SUMMARY OF THE INVENTION

An object of the present invention is to provide a function test support system and a function test support method and a hardware description model, where it is possible to confirm automatically, and reliably whether test items set by a designer have been tested by simulation; moreover, to easily detect test items made redundant and ones to be corrected after changing function descriptions; and further, to make tested test items clear, even when the function descriptions are reused.

In order to achieve the above object, the present invention is configured to have the following steps to support function tests of function descriptions where functions of an integrated circuit are described as a set of one or more element operations in a hardware description language: storing a correspondence relationship between test vectors of function simulations to verify function descriptions and test items tested according to the test vectors, and a message including at least test item names being generated during execution of function simulations and denoting that start conditions of the above test item names have been met; determining every test vector whether each test item has been tested or not, based on the above stored data; and performing report output of the determination results.

According to the present invention, the above report output showing whether test items have been tested or not may cause automatic and reliable confirmation of the results.

The present invention is configured to embed in function descriptions a statement to output a message including at least test item names, when start conditions of the test items have been met, and to store a message output by execution of the above statement.

According to the present invention, it may be possible to easily confirm whether test items have been tested or not, by use of embedded test item names in function descriptions.

Moreover, the present invention is configured to have the following steps: monitoring execution of the function simulation; installing a monitor to output messages including at least test item names, when start conditions of test items have been met; and storing messages output from the above monitor.

According to the present invention, it may be possible to easily confirm whether test items have been tested or not, by use of messages output by the above monitor after monitoring execution of function simulations.

Moreover, the present invention is configured to have the following steps to support function tests of function descriptions where functions of an integrated circuit are described as a set of one or more element operations in a hardware description language: storing messages including at least test item names and test vector names being generated during execution of the function simulation for verification of the function description and denoting that start conditions of the previously set test items have been met; determining every test vector whether each test items has been tested or not, based on the above stored data; and performing report output of the determination results.

Even in the present invention, the report output showing whether test items have been tested or not may also cause automatic and reliable confirmation of the results.

In addition, the present invention is configured to store expected value comparison results of function simulations; determine pass or fail of each test item every test vector, using the above stored data and messages; and to perform report output of the determination results.

In the present invention, it may be possible to easily confirm whether simulation results have been in a passed or failed state, considering whether test items have been met or not.

In addition, the present invention is configured to output every test vector a ratio of test items tested, or a ratio of test items not tested.

According to the present invention, it may be easily grasp the processed state of tests.

In addition, the present invention is further configured to specify a subset of test items, and to output results only for test vectors related with the above specified test items.

According to the present invention, it may be possible to obtain reports only for noticed test items.

And, the present invention is further configured to display a generated list of test items from statements included in function descriptions.

In the present invention, it may be possible to easily grasp the test items embedded in the function description.

According to the present invention, it may be possible to easily confirm whether test items have been tested or not in simulations, and, to secure automatic and reliable confirmation of the simulation results. Moreover, it may be also possible to easily detect test items made redundant, and ones to be corrected after changing function descriptions of a LSI to be designed. Further, it may be possible to make tested test items, that is, used functions and element operations, clear, even when function descriptions are reused.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, embodiments of the present invention will be described with reference to the drawings.

First Embodiment

A first embodiment will now be described.

Figure 1:
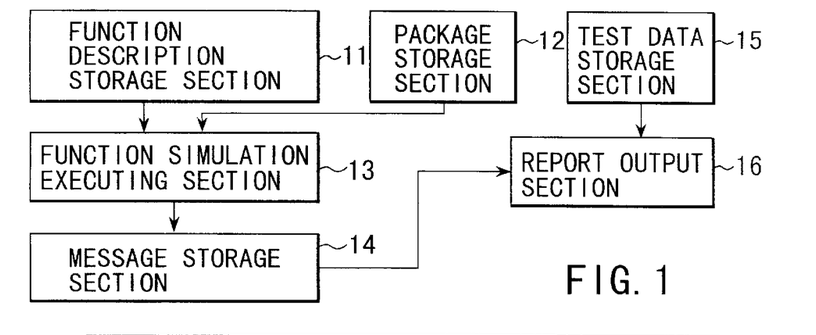
FIG. 1 is a diagram showing a function test support system according to a first embodiment of the present invention.

FIG. 1 shows a configuration diagram of a function test support system according to the first embodiment of the present invention.

Figure 2:
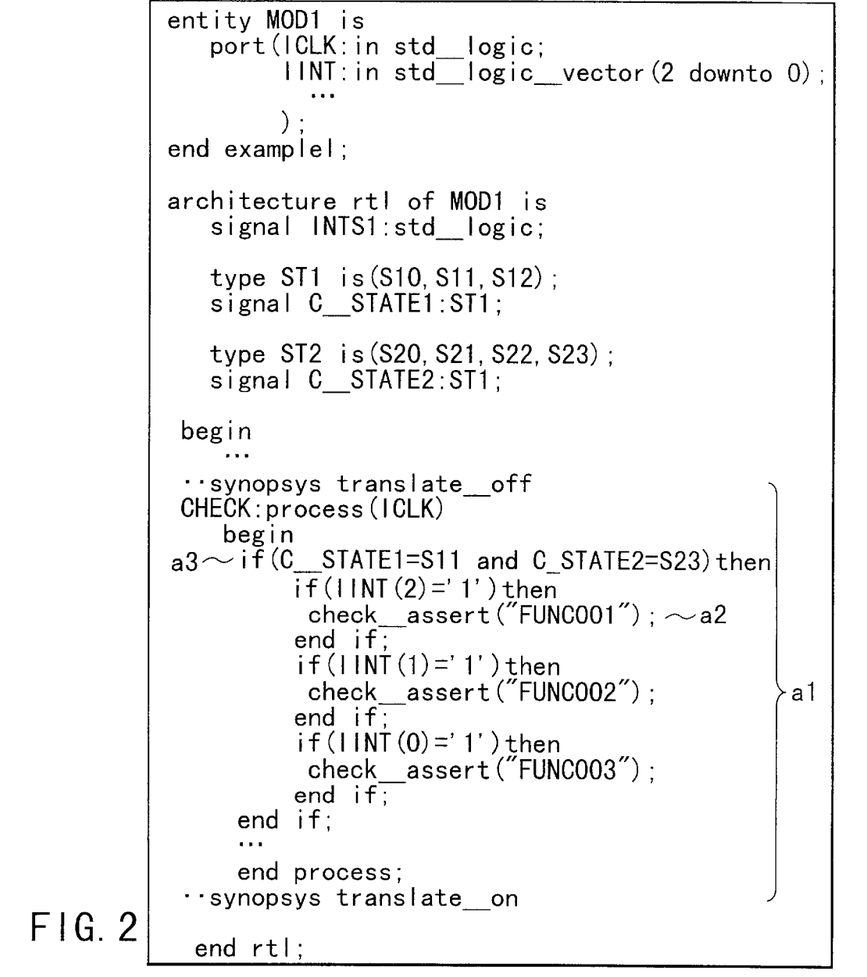
FIG. 2 is an example showing a function description stored in a function description storage section of the function test support system according to the first embodiment of the present invention.

A function description storage section 11 stores descriptions of a circuit for design in IEEE standard hardware description language VHDL having statements to output messages that test items have been tested. FIG. 2 shows an example of a function description stored in the function description storage section 11.

In FIG. 2, a1 shows a group of statements to output messages that test items have been tested. For example, a2 outputs a message that a test item of FUNC001 has been tested, when states of state machines of C_STATE1 and C_STATE2 are S11 and S23, respectively, and an external input IINT (2) is 1.

Figure 3:
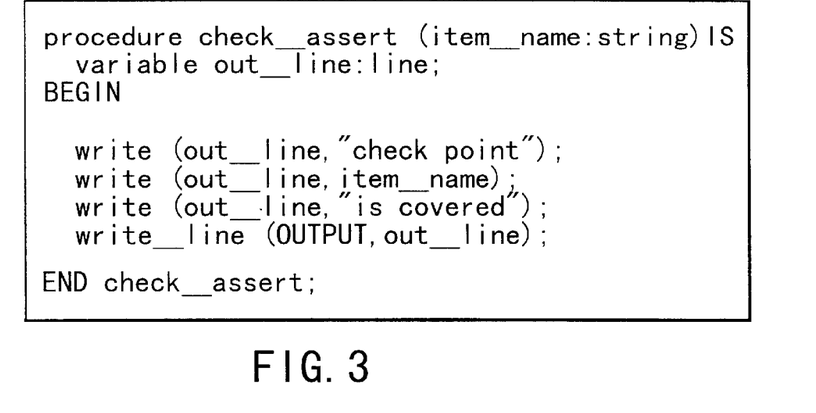
FIG. 3 is a diagram showing a definition of a procedure check_assert of the function test support system according to the first embodiment of the present invention.

A package storage section 12 stores a VHDL procedure check_assert used for output of a message that test items have been tested. FIG. 3 shows a definition of check_assert. The check_assert outputs a message as shown in FIG. 4 to a standard output file of STD_OUT by giving test items to arguments.

A function simulation executing section 13 binds VHDL descriptions stored in the function description storage section 11 and the package storage section 12 to perform simulation.

Figure 4:
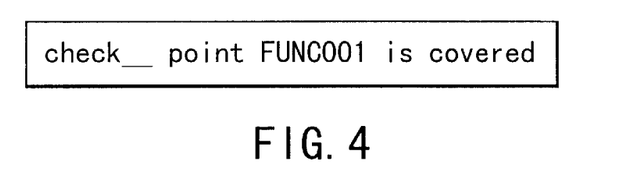
FIG. 4 is a diagram showing a message output by the procedure check_assert of the function test support system according to the first embodiment of the present invention.

A message storage section 14 stores messages in a form shown in FIG. 4 into a file named as "test vector name. out" every test vector, the above messages being output by check_assert after execution of the simulation.

Figure 5:
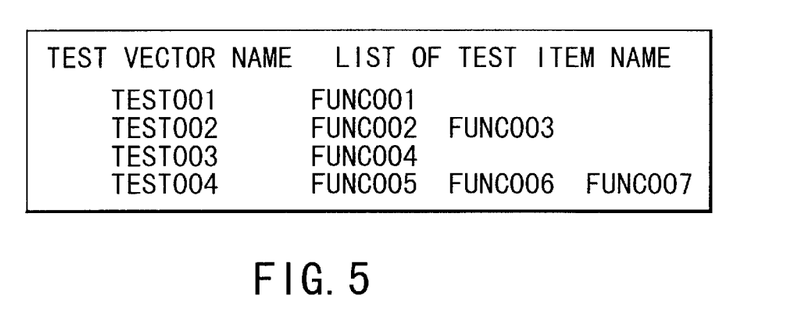
FIG. 5 is a diagram showing an example of data stored in a test data storage section of the function test support system according to the first embodiment of the present invention.

A test data storage section 15 stores correspondences of test vector names with test items (a plurality of the items in some cases) tested by the test vectors, as shown in FIG. 5. For example, it is shown that the test "TEST002" has been performed, when conditions for test items of "FUNC002" and "FUNC003" have been met.

Figure 6:
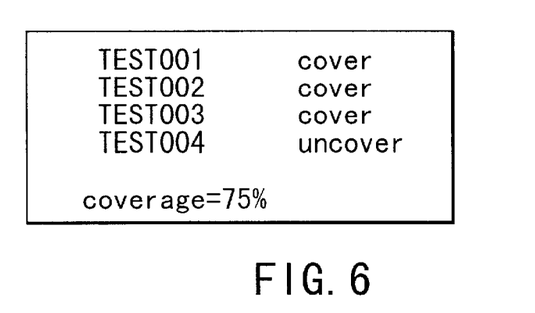
FIG. 6 is a diagram showing an example of a report output by a report output section 16 of the function test support system according to the first embodiment of the present invention.
Figure 7:
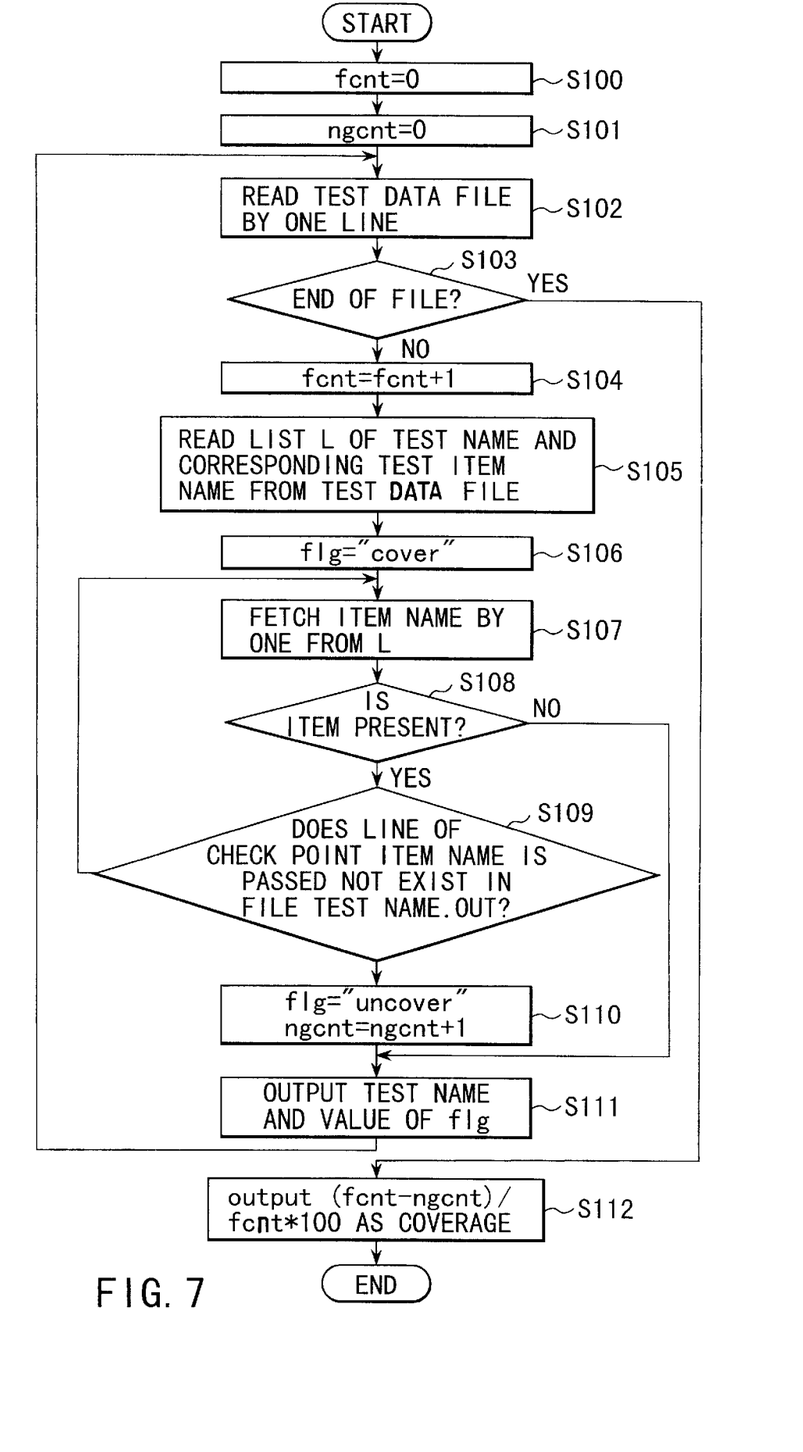
FIG. 7 is a diagram showing a process flow of the report output section of the function test support system according to the first embodiment of the present invention.
Figure 8A:
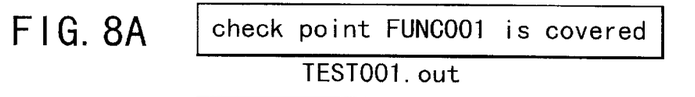
FIGS. 8A to 8D are diagrams showing examples of messages stored in a message storage section of the function test support system according to the first embodiment of the present invention.
Figure 8B:
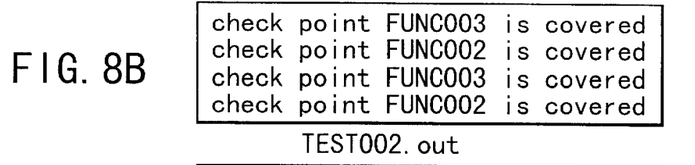
Figure 8C:
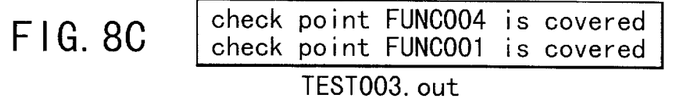
Figure 8D:
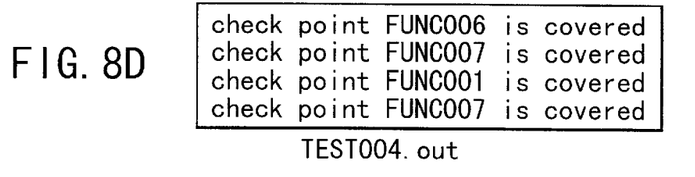

A report output section 16 determines, every test shown in FIG. 5 by input of messages in a form shown in FIG. 4 and stored in the message storage section 14, and data shown in FIG. 5 and stored in the test data storage section 15, whether all the test items have been tested; and outputs results in a format shown in FIG. 6, using a flag of "cover" if tested, and "uncover if not tested. Moreover, the report output section 16 displays a test coverage of the items with a flag of "cover" (a ratio (%) of the items with the flag of "cover" to all the items tested). FIG. 7 shows a process flow of the report output section 16.

The process flow will be described below with reference to the case where messages shown in FIGS. 8A to 8D are stored in the message storage section 14 respectively as files with file names of "TEST001". out"–"TEST004. out", as a result of the simulation by the function simulation executing section 13, and data shown in FIG. 5 are stored in the test data storage section 15.

The report output section 16 firstly fetches data in the test data storage section 15 shown in FIG. 5 line by line (Step S102); checks whether all the corresponding test items are included in the messages stored in the message storage section 14 (Step S105 to Step S109); outputs the checked results using a flag of "cover" or "uncover" (Step S111); and further, outputs a ratio of the test items with a flag of "cover" (Step S112).

Specifically, referring to the test "TEST001" at the first line in FIG. 5, the test item "FUNC001" is fetched, and "TEST001" and "cover" are output as shown at the first line of FIG. 6, as the file "TEST001. Out" of FIG. 8A includes the message of the item "FUNC001". Similarly, tests "TEST002" and "TEST003" have a flag "cover", but, as a test "TEST004" has test items of "FUNC005", "FUNC006", and "FUNC007", and the file "TEST004. out" of FIG. 8D does not include "FUNC005", "TEST004" and "uncover" are output. Moreover, as three tests among "TEST001" to "TEST004", except "TEST004" have a flag "cover", (3/4)×100=75% is output as coverage, as shown in FIG. 6.

As described above, in the function test support system of the first embodiment, it may be possible to perform confirmation automatically and reliably, as there are report outputs of simulation results showing whether test items have been tested or not, and a ratio of tested items, or not-tested items.

Second Embodiment

Now, a second embodiment of the present invention will be described.

Figure 9:
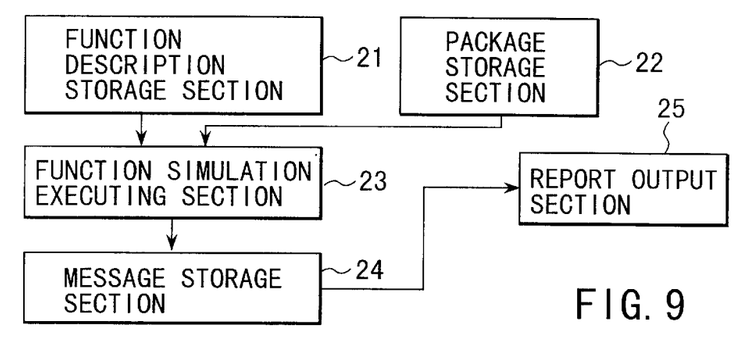
FIG. 9 is a configuration diagram of a function test support system according to a second embodiment of the present invention.

FIG. 9 shows a configuration diagram of a function test support system according to the second embodiment of the present invention. The configuration of the function test support system of the second embodiment has a similar configuration of the function test support system of the first embodiment shown in FIG. 1 except for the test data storage section 15. That is, in the function test support system of the first embodiment, correspondence data between test vector names and test items are given by the test data storage section 15, and in the function test support system of the second embodiment, a function description storage section 21 is embedded in a description of a circuit to be designed. In a statement to output a message that test items have been tested, test vector names are simultaneously output with the test items. Moreover, the test item names related with one test vector are named based on a rule as 1/n, 2/n, . . . , n/n (wherein n is the total number of the test items related with one test vector).

Figure 10:
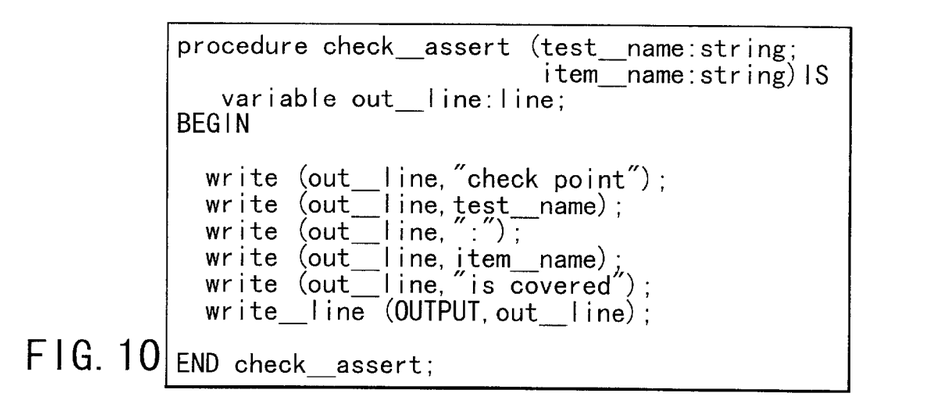
FIG. 10 is a diagram showing a definition of a procedure check_assert stored in a package storage section of the function test support system according to the second embodiment of the present invention.
Figure 11:
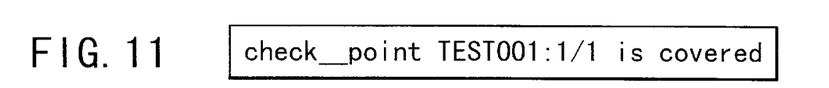
FIG. 11 is a diagram showing a message output by check_assert of the function test support system according to the second embodiment of the present invention.
Figure 12:
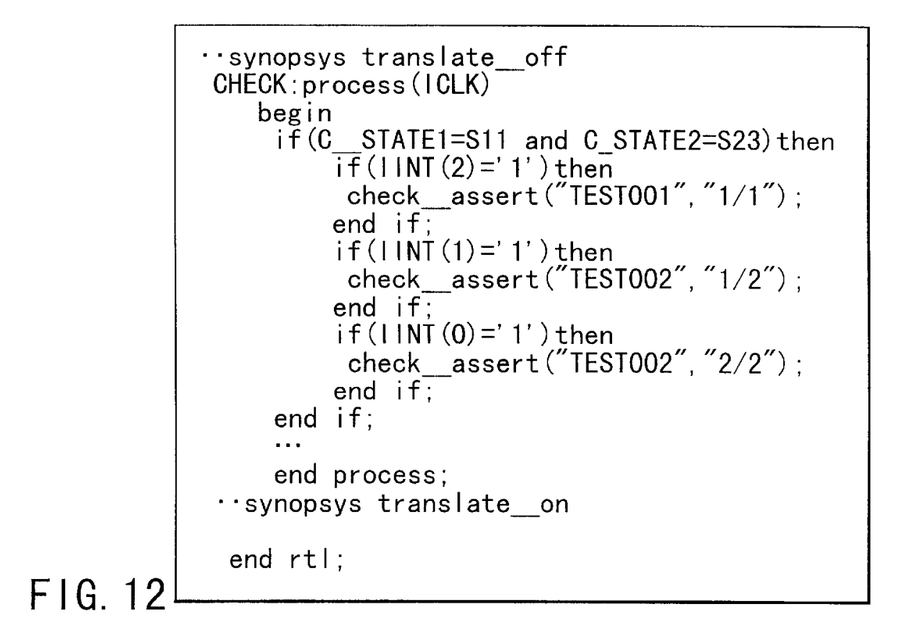
FIG. 12 is a diagram showing an example of a description stored in a function description storage section of the function test support system according to the second embodiment of the present invention.
Figure 13A:
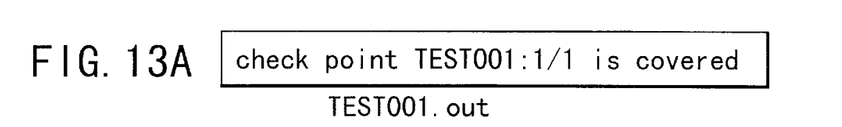
FIGS. 13A to 13D are diagrams showing examples of messages stored in a message storage section of the function test support system according to the second embodiment of the present invention.
Figure 13B:
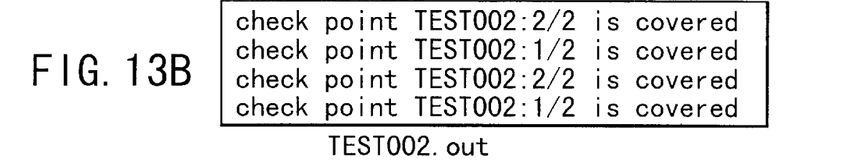
Figure 13C:
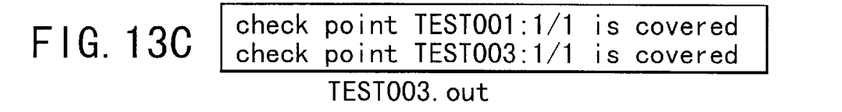
Figure 13D:
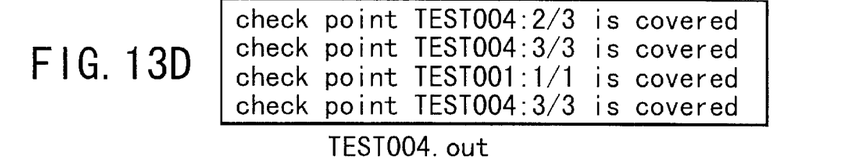

A package storage section 22 stores a procedure of check_assert shown in FIG. 10. Check_assert outputs a message shown in FIG. 11 to a standard output file of STD_OUT with test vector names and test items given as arguments. FIG. 12 shows an example of a description stored in the function description storage section 21. Moreover, as simulation results by a function simulation executing section 23, FIGS. 13A to 13D show messages stored in the message storage section 24. Messages are configured to be stored in files named as "test vector name. Out" similarly to the first embodiment.

If all the messages of "test vector name: 1/n" to "test vector name: n/n", are included in the above files, the test is determined as "cover", and, if not, as "uncover", and the determination results and a ration of "cover" are output by a report output section 25 as shown in FIG. 6, similarly to the first embodiment.

As described above, in the function test support system of the second embodiment, it may be also possible to perform confirmation automatically and reliably, as there are report outputs of simulation results showing whether test items have been tested or not, and a ratio of tested items or not-tested items.

Third Embodiment

Now, a third embodiment of the present invention will be described.

Figure 14:
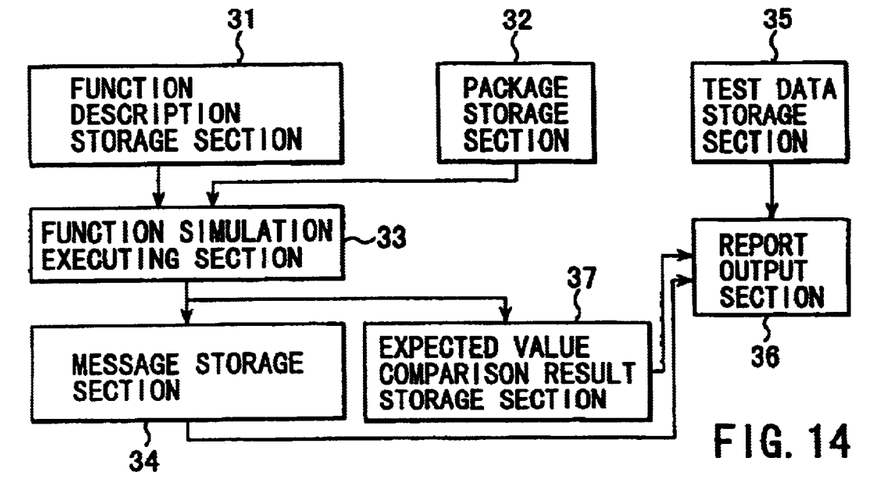
FIG. 14 is a configuration diagram of a function test support system according to a third embodiment of the present invention.

FIG. 14 shows a configuration diagram of a function test support system according to the third embodiment of the present invention. The configuration of the support system of the third embodiment has a similar configuration of the function test support system of the first embodiment shown in FIG. 1 except that an expected value comparison storage section 37 is added to the first embodiment.

Figure 15:
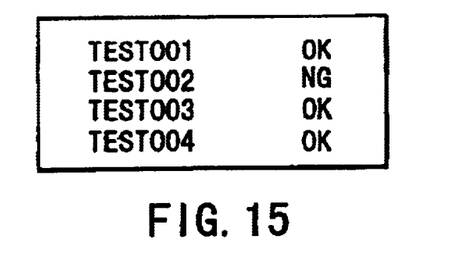
FIG. 15 is a diagram showing an example of data stored in an expected value comparison result storage section of the function test support system according to the third embodiment of the present invention.

An expected value comparison result storage section 37 stores expected value comparison results of simulations by a function simulation executing section 33 in a format as shown in FIG. 15.

Figure 16:
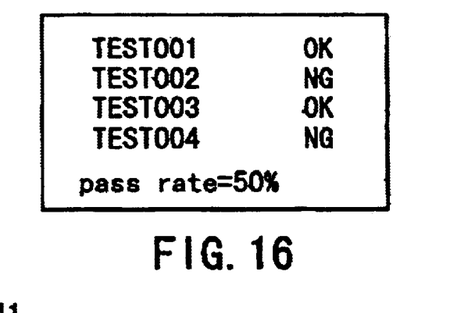
FIG. 16 is a diagram showing an output result by a report output section of the function test support system according to the third embodiment of the present invention.

A report output section 36 inputs data in the message storage section 34, the test data storage section 35, and the expected value comparison result storage section 37; determines pass or fail of each test item; and outputs the determination results and the pass ratio as shown in FIG. 16. That is, each test is determined as OK, if all the test items related with the test are met, and the expected value comparison result is OK, and as NG if not so. That is, when data in FIGS. 13, 15, and 5 are stored in the message storage section 34, the expected value comparison result storage section 37, and the test data storage section 35, respectively, FIG. 6 described in the above first embodiment is data showing whether test items of each test have been met or not, and the report output section 36 computes the logical product of the above data with data of the expected value comparison result storage section 37 to perform report output of the results. For example, "TEST001" and "TEST003" are output as OK as shown in FIG. 16, as the test item and the expected value comparison result are "cover", and OK, respectively, as shown in FIGS. 6 and 15. Similarly, "TEST002" and "TEST004" are output as NG, as they have "uncover" and NG in the test item and the expected value comparison result, respectively. Moreover, the pass ratio of (2/4)×100=50% is output.

Thereby, in the function test support system of the third embodiment, it may be also possible to perform confirmation automatically and reliably, as there are report outputs of simulation results showing whether test items have been tested or not, and a ratio of tested items or not-tested items.

Figure 17:
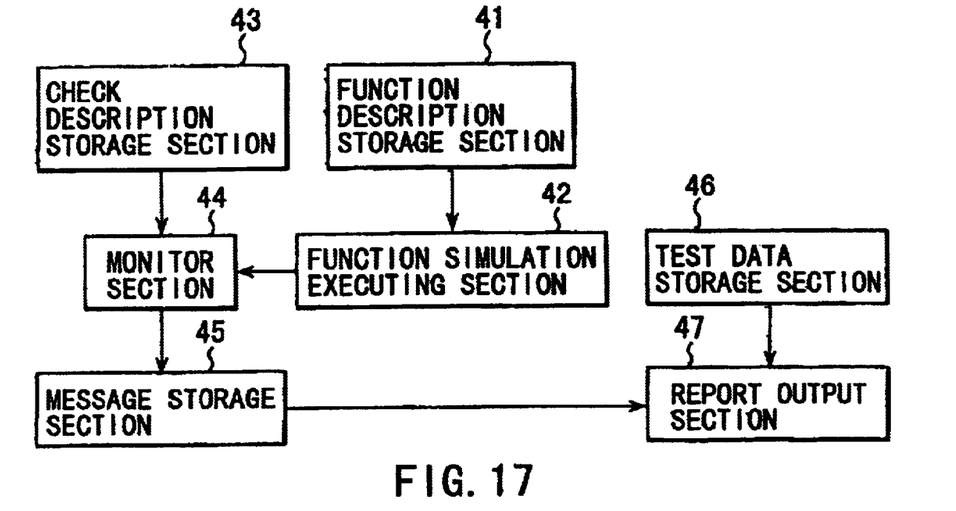
FIG. 17 is a configuration diagram of a function test support system provided with a monitor section to monitor simulations according to the present invention.

However, in the function test support system according to the first to third embodiments, there have been described examples in which data showing that test items have been tested are obtained by embedding statements which output messages that test items have been tested, into the description of the circuit to be designed, the description being stored in the function description storage section. Other than the above, data showing that test items have been tested may be also obtained by a monitor section 44 installed to monitor simulations by a function simulation executing section 42, according to data specifying a description stored in a check description storage section 43 to check the tested state, for example, as shown in FIG. 17. In this case, there is no need to embed a statement to output a message that test items have been tested into the description of the circuit to be designed, the above description being stored in the function description storage section 41. Thereby, there is no need to install the package storage section to store the VHDL procedure check_assert used to output a message that the test items have been tested.

Now, variations applicable to the function test support system of the first to third embodiments will be described below.

(1) A test item specification section to specify a subset of test items is installed, and a report output section outputs determination results only for test vectors related with test items specified by the test item specification section. Thereby, it may be possible to easily know whether a part of test items noticed by a designer have been tested or not.

(2) When a description such as al in FIG. 2 is embedded in the function description storage section, only data showing that test items which a specific designer takes charge, and test items in a specific module have been tested are configured to be output to the message storage section, so as to make only description described by a specific designer or one in a specific module, during the simulation. For example, the above may be realized by including descriptions after a3 in FIG. 2 into a conditional statement of IF (FOCUS_ID==identifier). Here, FOCUS_ID is a global signal of an integer type defined in the package storage section, and read from an external file at the beginning of the simulation. On the other hand, the identifier is an integral constant value (1, 2, and the like), and a unique value for each designer or each module embedding the description. That is, for example, by previously setting 1 to the external file, a description written in an IF sentence having 1 as the identifier is executed to output a message by check_assert. Thereby, it may be possible to effectively obtain data on a part of test items noticed by a designer.

(3) It may be possible to easily know whether test items related with a part of test vectors noticed by a designer have been tested or not by storing data not on test items related with all the test vectors, but on the test items related with a part of test vector.

Figure 18:
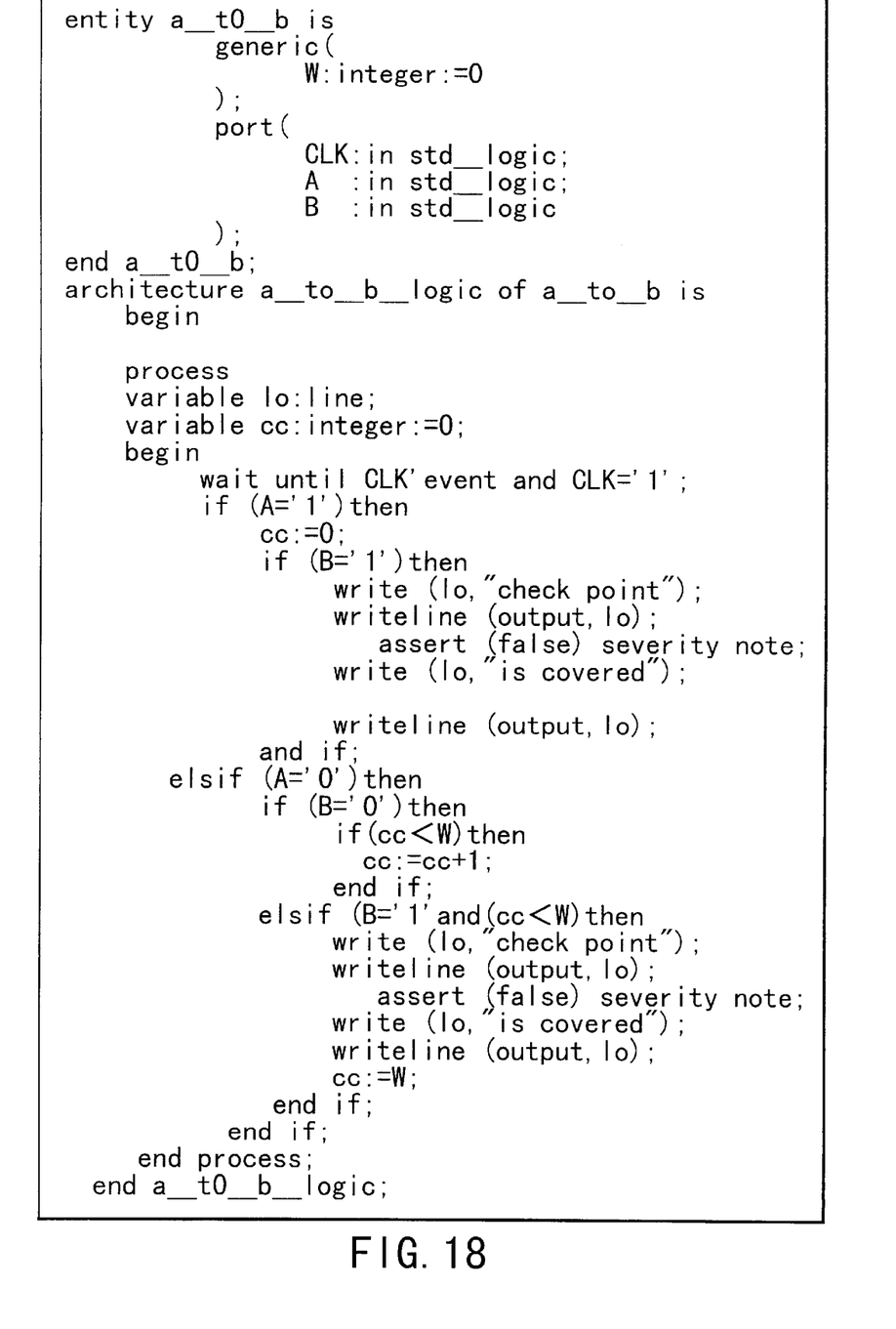
FIG. 18 is a diagram showing a description of a module of a_to_b used in a function test support system according to a modification of the present invention.
Figure 19:
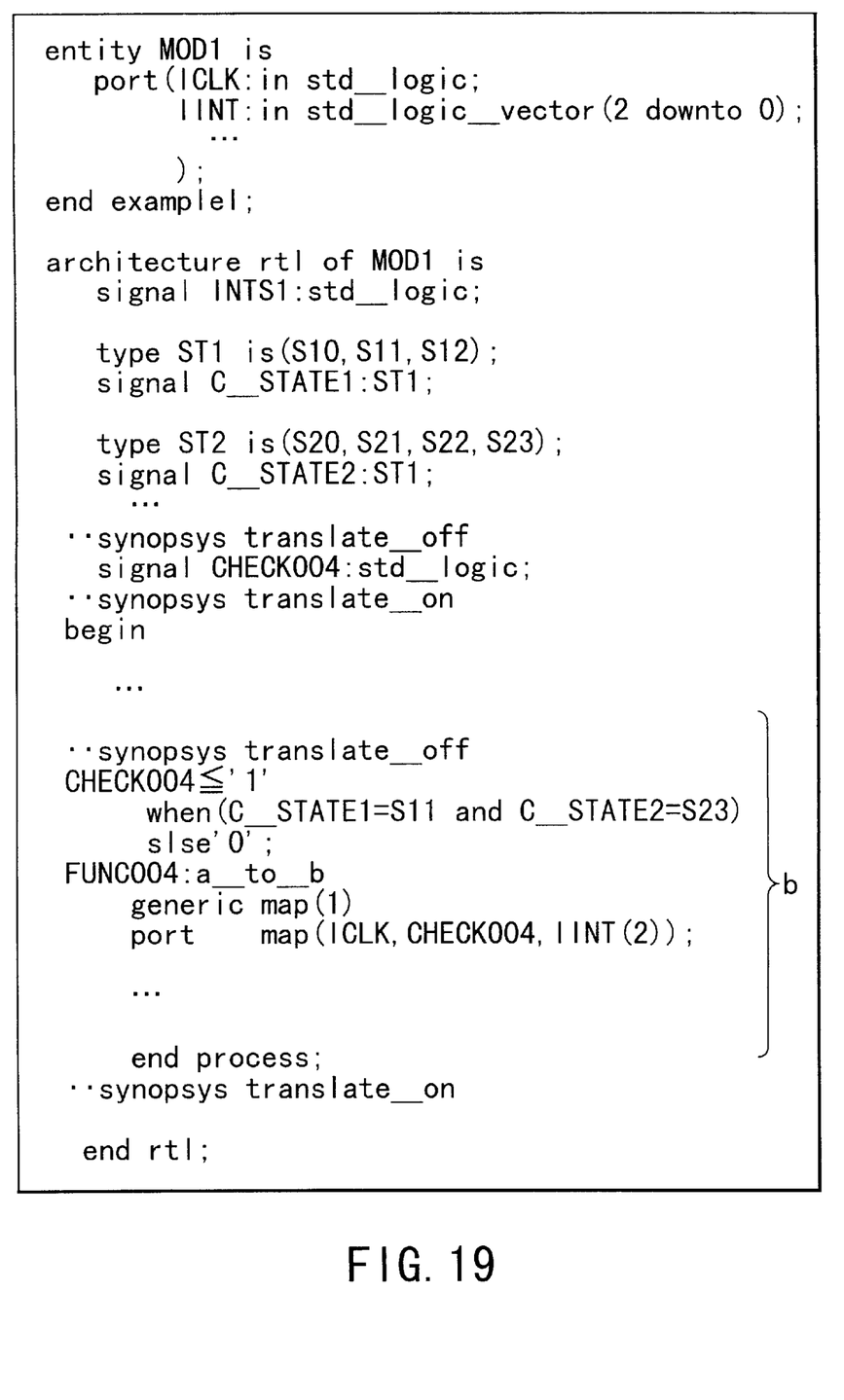
FIG. 19 is a diagram showing an example of a message stored in a message storage section of the function test support system according to the modification of the present invention.
Figure 20:
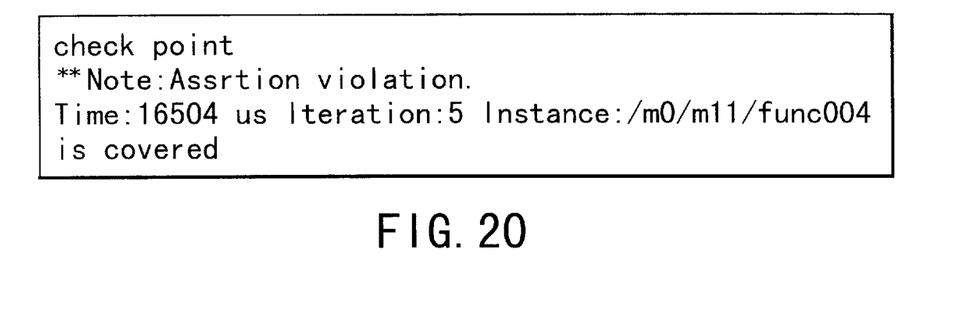
FIG. 20 is a diagram showing an example of a message output by execution of the description in FIG. 18.

(4) It may be possible to embed test items to function descriptions by use of descriptions such as a module a_to_b shown in FIG. 18 as a component instance as shown in FIG. 19. Here, the component instance name is assumed to be a test item name. The description in FIG. 18 outputs a message as shown in FIG. 20, when a signal B becomes 1 within W cycles after a signal A becomes 1. Here, hierarchical path names of FIG. 20 are output, and test item names may be fetched by executing an "assert" statement in FIG. 19. Thereby, it may be possible to easily confirm by use of a common module a_to_b as shown in FIG. 18 whether a relationship among signals at a plurality of times has been tested or not. Moreover, when one module is made to a plurality of instances, there are a plurality of modules having the same test item. But, according to the present method, it may be possible to confirm every instance whether test items have been tested or not.

(5) The report output section 25 outputs pass or fail results of the tests by adding an expected value comparison result storage section to the configuration of FIG. 9, similarly to the configuration of FIG. 14.

Moreover, in this case, and in the case of FIG. 14, the report output section may output not only a pass or fail result of the final test, but also data showing whether the test items shown in FIG. 6 according to the first embodiment have been tested or not.

Figure 21:
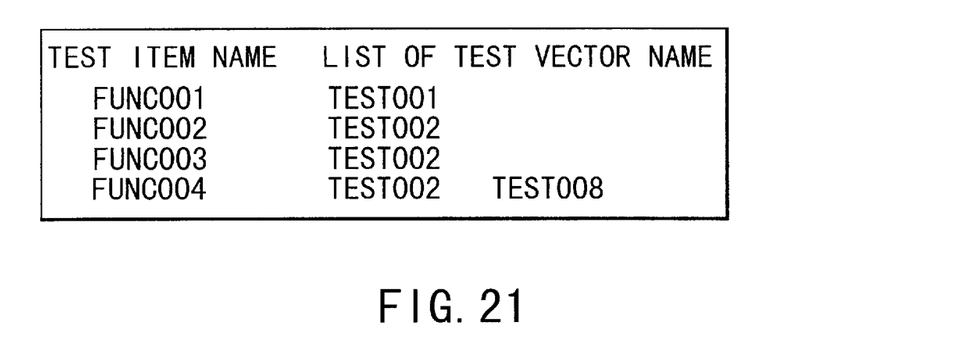
FIG. 21 is a diagram showing an example of data stored in a test data storage section of the function test support system according to the modification of the present invention.
Figure 22:
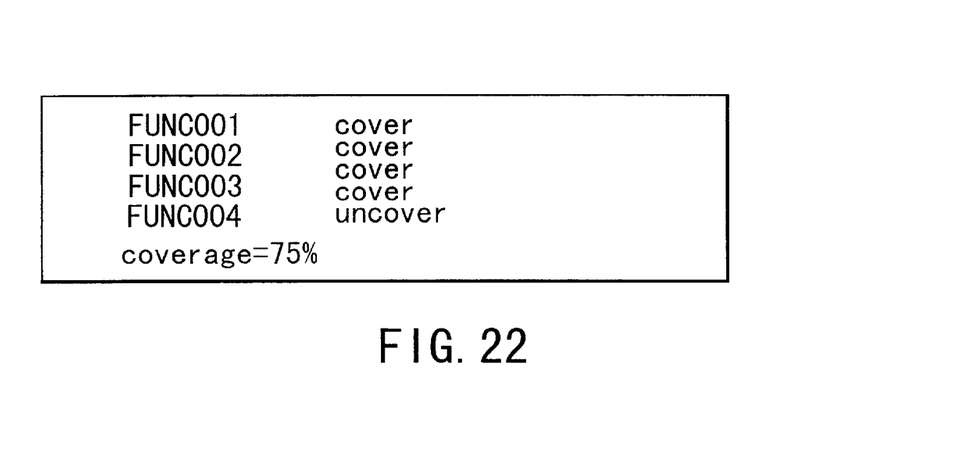
FIG. 22 is a diagram showing an example of an output result by a report output section of the support system according to the modification of the present invention.

(6) The test data storage section stores data on corresponding test vectors every test item, as shown in FIG. 21. Similarly, the report output section outputs a determination result showing whether test items have been met for all the test vectors as test objects, as shown in FIG. 22. At this time, similarly to (1), a test item specification section to specify a subset of test items may be installed; and the report output section may output determination results showing whether specified items have been met or not for all the related test vectors. Thereby, it may be possible to know whether a part of test items noticed by a designer has been tested or not.

(7) A function to display a list of test item names embedded by analysis of function description is added, a designer adds a test vector name to the displayed data, and data in the test data storage section shown in FIG. 5 and FIG. 21 are created. Thereby, it may be possible to easily create data in the test data storage section, and easily confirm the embedded test items.

(8) The report output section displays names of test vectors according to which test items have not been tested, and a ratio of not tested items, or names of test vectors according to which test items have been tested, and a ratio of tested items.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A function test support system comprising:

means for storing procedures for outputting a text message indicating that a predetermined condition is satisfied;

means for storing a circuit description described in a hardware description language, the circuit description including a statement for executing one of the procedures when a predetermined condition is satisfied; and means for simulating the circuit description stored in circuit description storing means, determining whether the predetermined condition is satisfied, and executing a procedure when the predetermined condition is satisfied.

2. The function test support system according to claim 1, further comprising:

means for storing the text message outputted by executing the procedure; means for storing test data indicating a correspondence between a test vector and a condition included in the test vector; and means for outputting a text report indicating whether the condition included in the test vector is satisfied or not.

3. The function test support system according to claim 2, further comprising:

means for storing an expected value comparison result of said circuit description simulations, said report output means determines for every test vector whether each condition is satisfied or not, based on data stored in said expected value comparison storage means and messages stored in said message storage means, and outputs a report of the determination results.

4. The function test support system according to claim 2, wherein said text report output-means comprises means for outputting a ratio of the conditions which are satisfied for every test vector or a ratio of the conditions which are not satisfied for every test vector.

5. The function test support system according to claim 2, wherein said system further comprises means for specifying a subset of said conditions, said text report output means comprises means for outputting results only for test vectors related with conditions specified by said subset specifying means.

6. The function test support system according to claim 1, further comprising:

means for displaying a list of said conditions included in the statements included in said circuit description.

7. A function test support system comprising:

means for storing procedures for outputting a text message indicating that a predetermined condition is satisfied;

means for storing a circuit description described in a hardware description language, the circuit description including a statement for executing one of the procedures when a predetermined condition is satisfied, the condition being identified by a relative name of the condition included in a test vector; and means for simulating the circuit description stored in the circuit description storing means, for determining whether the predetermined condition is satisfied, and for executing a procedure when the predetermined condition is satisfied.

8. The function test support system according to claim 7, further comprising:

means for storing the text message outputted by executing the procedure; and means for outputting a text report indicating whether the condition included in the test vector is satisfied or not.

9. The function test support system according to claim 8, further comprising:

means for storing an expected value comparison result of said circuit description simulations, said report output means determines for every test vector whether each condition is satisfied or not, based on data stored in said expected value comparison storage means and messages stored in said message storage means, and outputs a report of the determination results.

10. The function test support system according to claim 8, wherein said text report output means comprises means for outputting a ratio of the conditions which are satisfied for every test vector or a ratio of the conditions which are not satisfied for every test vector.

11. The function test support system according to claim 8, wherein said system further comprises means for specifying a subset of said conditions, said text report output means comprises means for outputting results only for test vectors related with conditions specified by said subset specifying means.

12. The function test support system according to claim 7, further comprising:

means for displaying a list of said conditions included in the statements included in said circuit description.

13. A function test support method comprising:

storing procedures for outputting a text message indicating that a predetermined condition is satisfied;

storing a circuit description described in a hardware description language, the circuit description including a statement for executing one of the procedures when a predetermined condition is satisfied; and simulating the circuit description stored in circuit description, determining whether the predetermined condition is satisfied, and executing a procedure when the predetermined condition is satisfied.

14. The function test support method according to claim 13, further comprising:

storing the text message outputted by executing the procedure;

storing test data indicating a correspondence between a test vector and a condition included in the test vector; and outputting a text report indicating whether the condition included in the test vector is satisfied or not.

15. The function test support method according to claim 14, further comprising:

storing an expected value comparison result of said circuit description simulations, wherein outputting a text report includes determining for every test vector whether each condition is satisfied or not, based on data stored in said expected value comparison result and stored messages, and outputting a report of the determination results.

16. The function test support method according to claim 14, wherein outputting a report comprises means for outputting a ratio of the conditions which are satisfied for every test vector or a ratio of the conditions which are not satisfied for every test vector.

17. The function test support method according to claim 14, wherein said method further comprises specifying a subset of said conditions, and wherein outputting a report comprises outputting results only for test vectors related with conditions specified by said subset specifying means.

18. The function test support method according to claim 13, further comprising:

displaying a list of said conditions included in the statements included in said circuit description.

19. A function test support method comprising:

storing procedures for outputting a text message indicating that a predetermined condition is satisfied;

storing a circuit description described in a hardware description language, the circuit description including a statement for executing one of the procedures when a predetermined condition is satisfied, the condition being identified by a relative name of the condition included in a test vector; and simulating the stored circuit description, for determining whether the predetermined condition is satisfied, and for executing a procedure when the predetermined condition is satisfied.

20. The function test support method according to claim 19, further comprising:

storing the text message outputted by executing the procedure; and outputting a text report indicating whether the condition included in the test vector is satisfied or not.

21. The function test support method according to claim 20, further comprising:

storing an expected value comparison result of said circuit description simulations, wherein outputting a text report comprises determining for every test vector whether each condition is satisfied or not, based on the stored expected value and said stored messages, and outputting a report of the determination results.

22. The function test support method according to claim 20, wherein outputting a text report comprises outputting a ratio of the conditions which are satisfied for every test vector or a ratio of the conditions which are not satisfied for every test vector.

23. The function test support method according to claim 20, wherein said method further comprises specifying a subset of said conditions, wherein outputting a text report comprises outputting results only for test vectors related with conditions specified by said subset specifying means.

24. The function test support method according to claim 19, further comprising:

displaying a list of said conditions included in the statements included in said circuit description.

* * * * *